(12) United States Patent
Shim et al.

(10) Patent No.: US 11,996,393 B2
(45) Date of Patent: May 28, 2024

(54) INTELLIGENT INTEGRATED ASSEMBLY AND TRANSFER APPARATUS FOR SEMICONDUCTOR LIGHT EMITTING DEVICE

(71) Applicant: LG ELECTRONICS INC., Seoul (KR)

(72) Inventors: Bongchu Shim, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 925 days.

(21) Appl. No.: 17/013,201

(22) Filed: Sep. 4, 2020

(65) Prior Publication Data

US 2021/0358893 A1 Nov. 18, 2021

(30) Foreign Application Priority Data

May 14, 2020 (KR) .......................... 10-2020-0057811

(51) Int. Cl.
*H01L 25/075* (2006.01)
*H01L 21/67* (2006.01)
*H01L 33/00* (2010.01)

(52) U.S. Cl.
CPC .... *H01L 25/0753* (2013.01); *H01L 21/67253* (2013.01); *H01L 33/005* (2013.01)

(58) Field of Classification Search
CPC ........... H01L 25/0753; H01L 21/67253; H01L 33/005
USPC ........................................................ 209/606
See application file for complete search history.

(56) References Cited

U.S. PATENT DOCUMENTS

| 9,825,202 B2 | 11/2017 | Schuele et al. |
| 2008/0023296 A1 | 1/2008 | Aoyama et al. |
| 2009/0218260 A1* | 9/2009 | Chow ................... B81C 99/002 700/227 |

(Continued)

FOREIGN PATENT DOCUMENTS

| EP | 1 801 046 A1 | 6/2007 | |
| EP | 1801046 A1 * | 6/2007 | ....... A61F 13/15764 |
| EP | 2 688 093 A1 | 1/2014 | |

(Continued)

*Primary Examiner* — Terrell H Matthews
(74) *Attorney, Agent, or Firm* — Birch, Stewart, Kolasch & Birch, LLP

(57) ABSTRACT

The embodiment relates to an intelligent integrated assembly and transfer apparatus. The intelligent integrated assembly and transfer apparatus according to the embodiment can include a fluid chamber 300, a roller unit 200 and assembly inspection unit 500. The fluid chamber 300 can accommodate semiconductor light emitting devices 150. Semiconductor light emitting devices 150 can be assembled on an assembly substrate 210. The assembly substrate 210 can be mounted on the roller unit 200. The roller unit 200 can rotate the assembly substrate 210. The assembly inspection unit 500 can inspect the semiconductor light emitting devices 150 assembled on the assembly substrate 210. The roller unit 200 can include a roller rotated part 220 where the assembly substrate 210 is mounted and rotated, a roller driving part 230 for rotating the roller rotated part 220, and a magnet head unit 400 for applying magnetic force to the semiconductor light emitting devices 150 to be assembled on the assembly substrate 210.

11 Claims, 12 Drawing Sheets

(56) References Cited

U.S. PATENT DOCUMENTS

2015/0050761 A1    2/2015    Karlicek et al.

FOREIGN PATENT DOCUMENTS

| | | | | |
|---|---|---|---|---|
| EP | 2688093 | A1 * | 1/2014 | ........... B23K 1/0016 |
| EP | 3910665 | A4 * | 11/2021 | ....... H01L 21/67144 |
| KR | 20200014866 | A * | 1/2020 | |
| KR | 10-2020-0014866 | A | 2/2020 | |
| WO | WO2013/158949 | A1 | 10/2013 | |
| WO | WO-2013158949 | A1 * | 10/2013 | ......... H01L 21/6836 |

\* cited by examiner

[Figure 1]
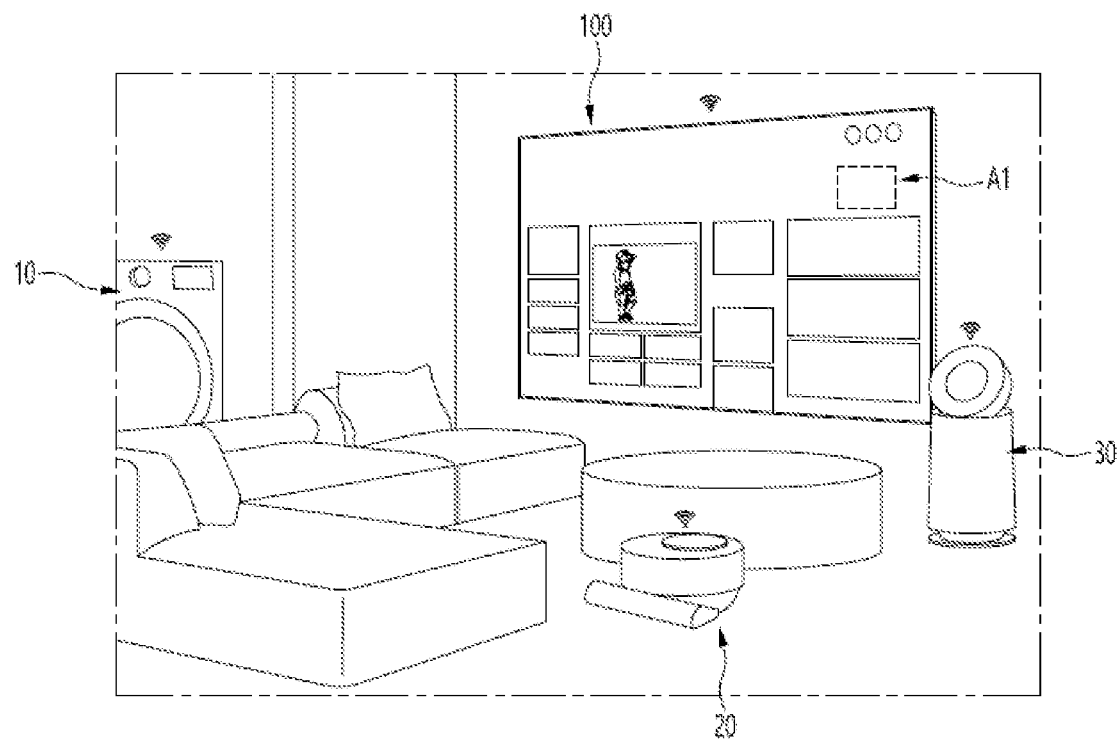

[Figure 2a]
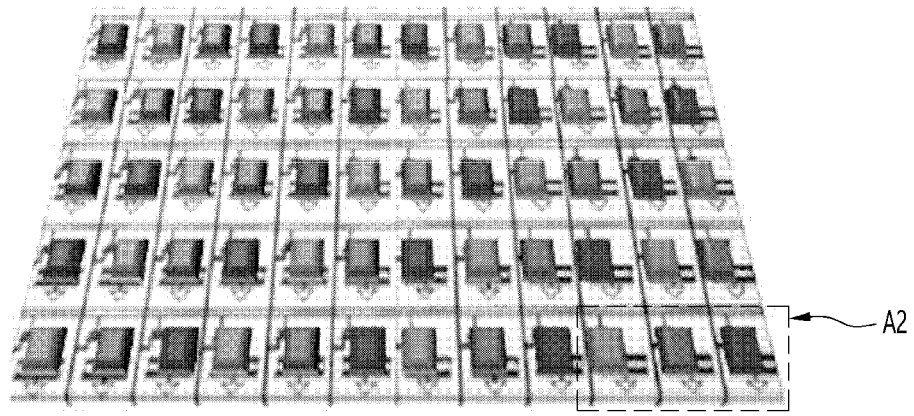
[Figure 2b]
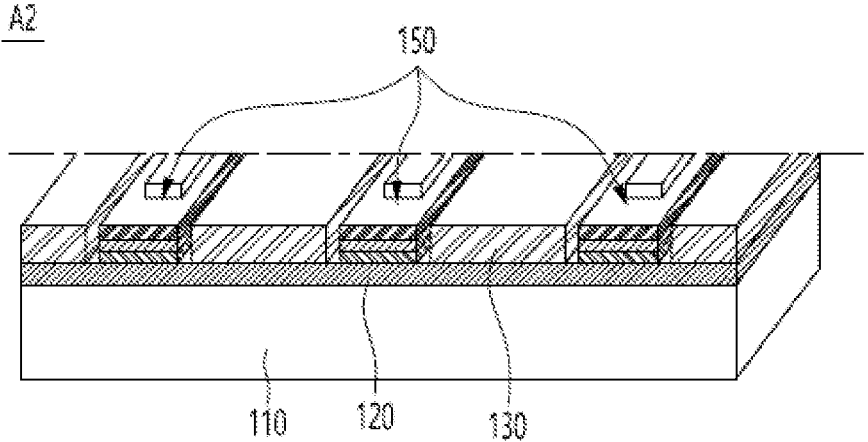

[Figure 2c]
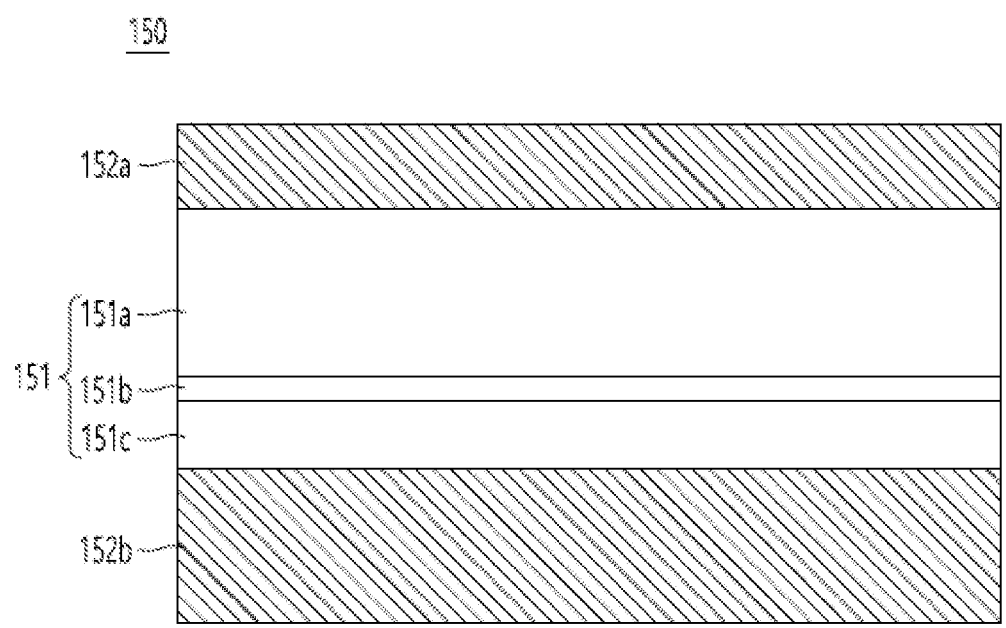

[Figure 3]
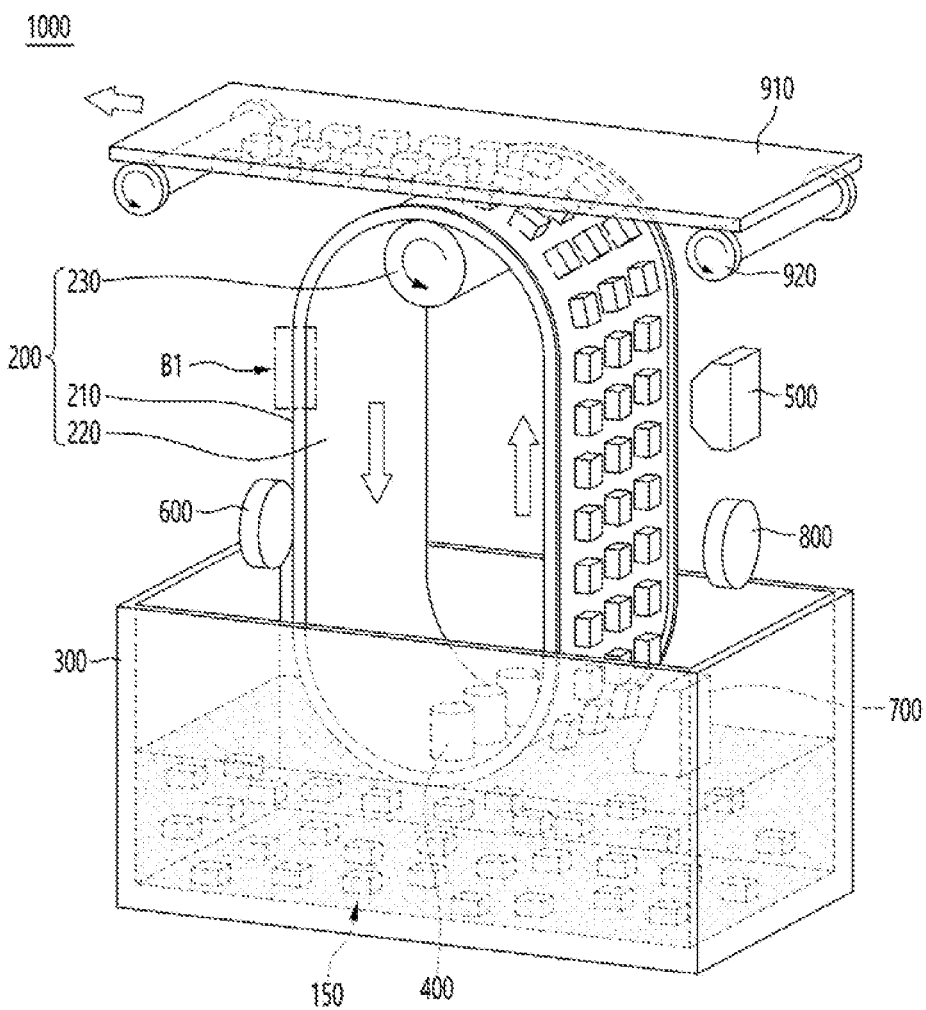

[Figure 4]
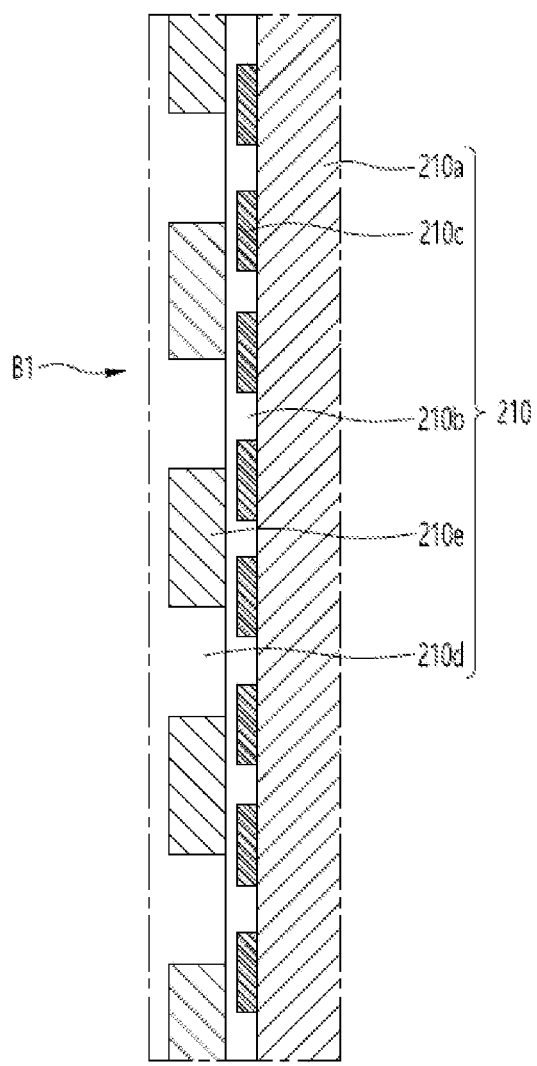

[Figure 5a]
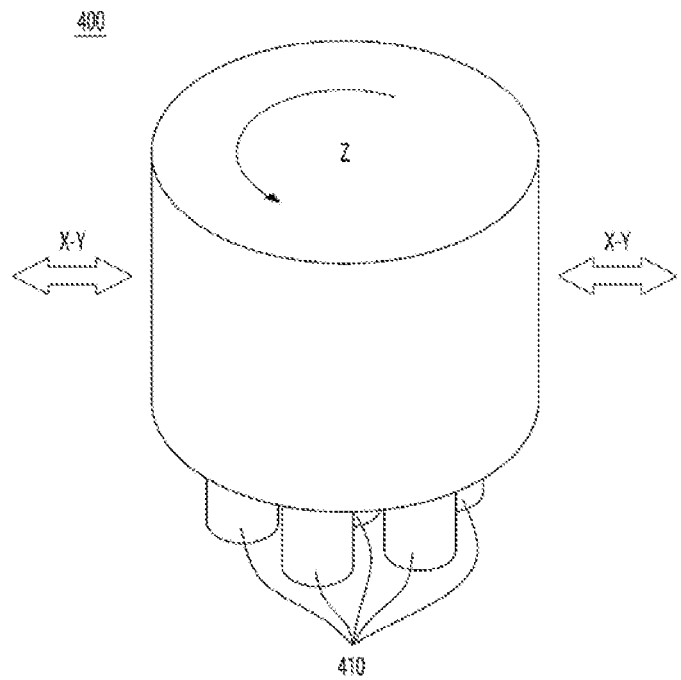
[Figure 5b]
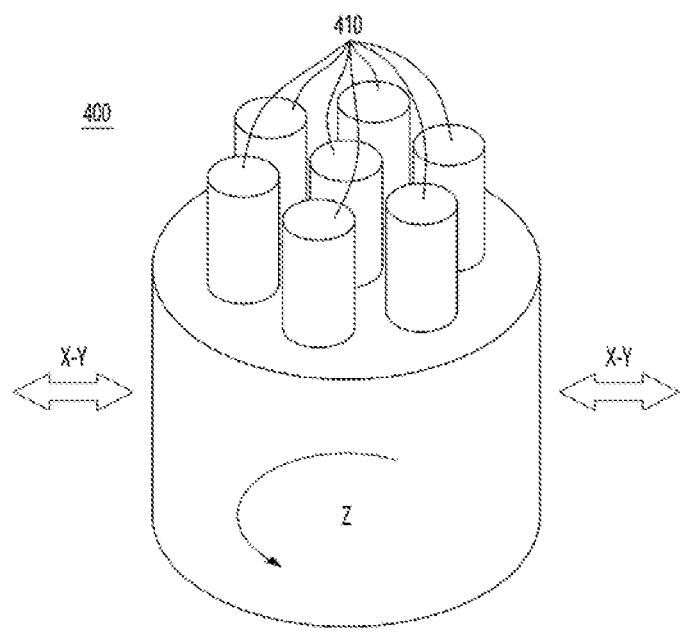

[Figure 6]
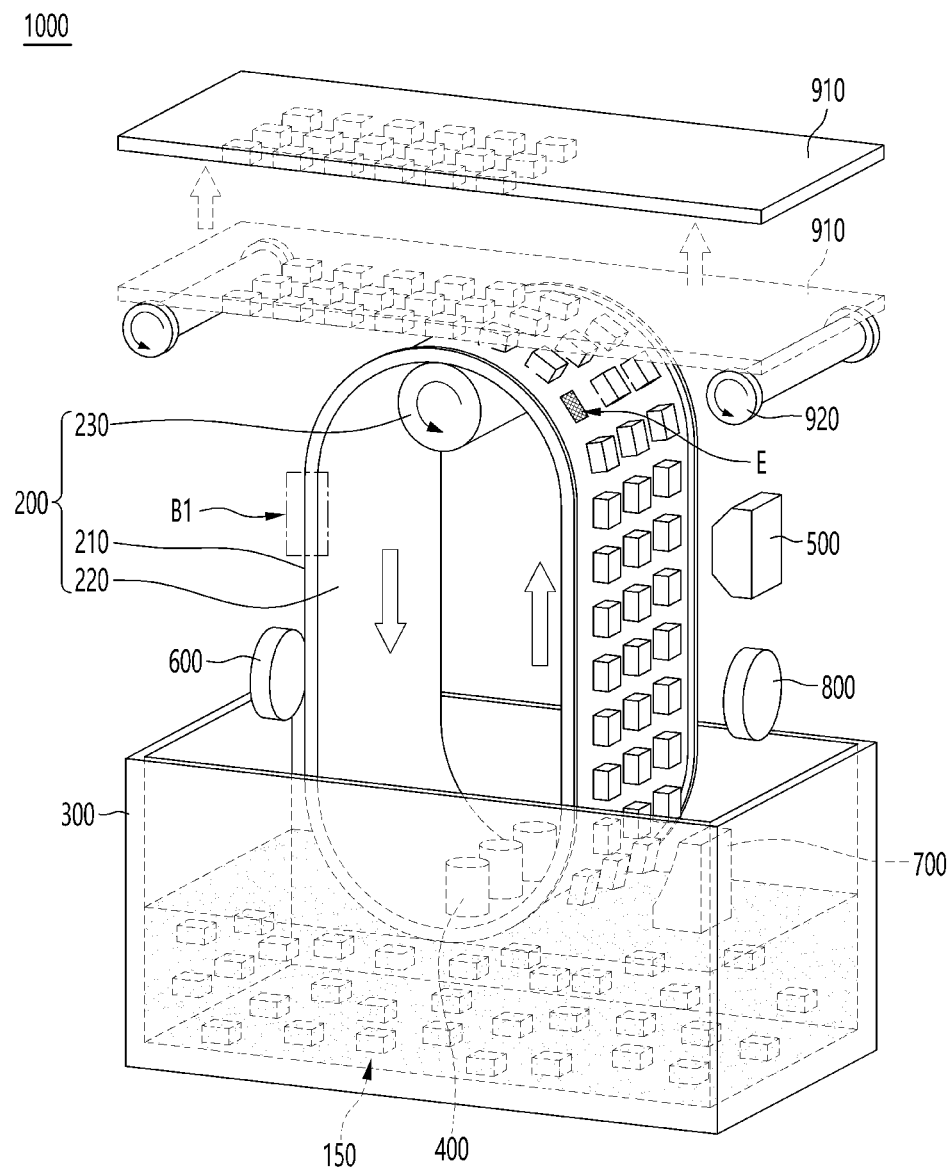

[Figure 7]
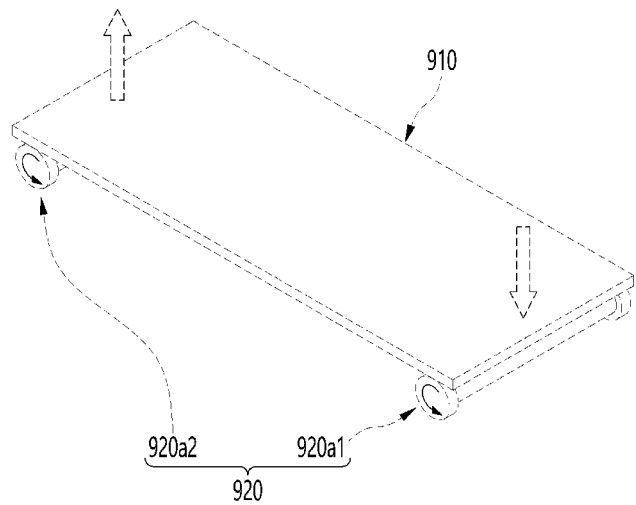
(A)
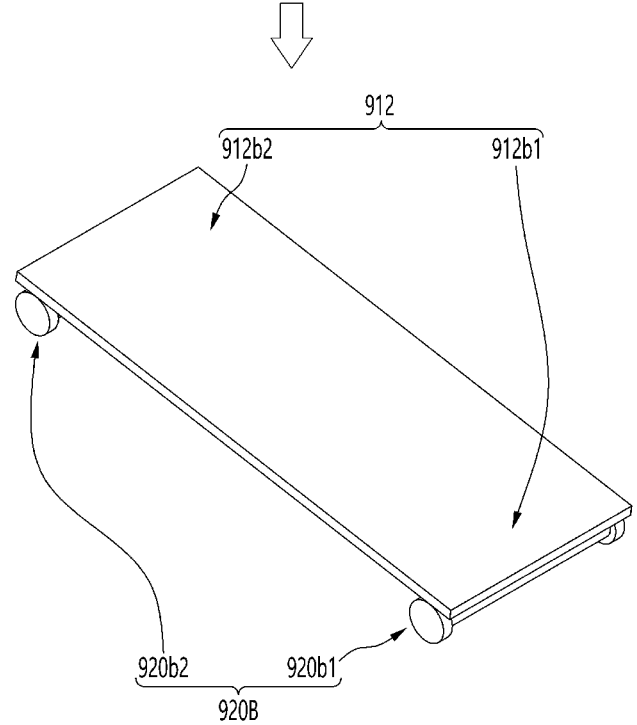
(B)

[Figure 8a]
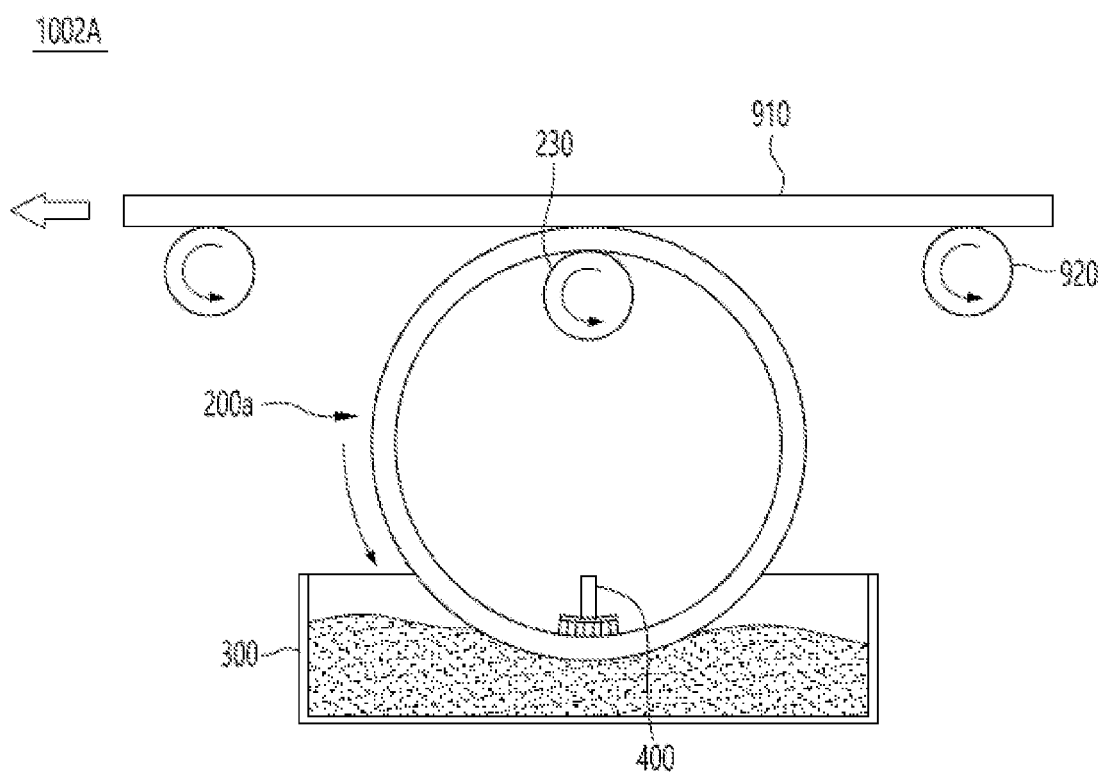

[Figure 8b]
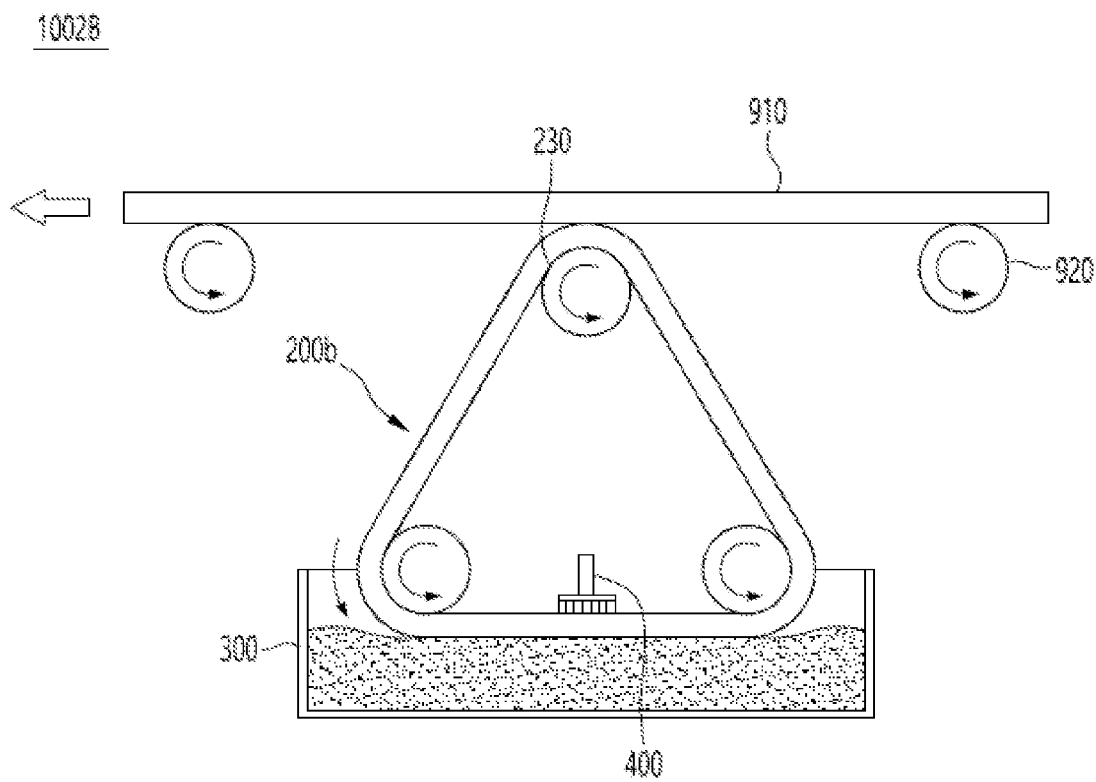

[Figure 8c]
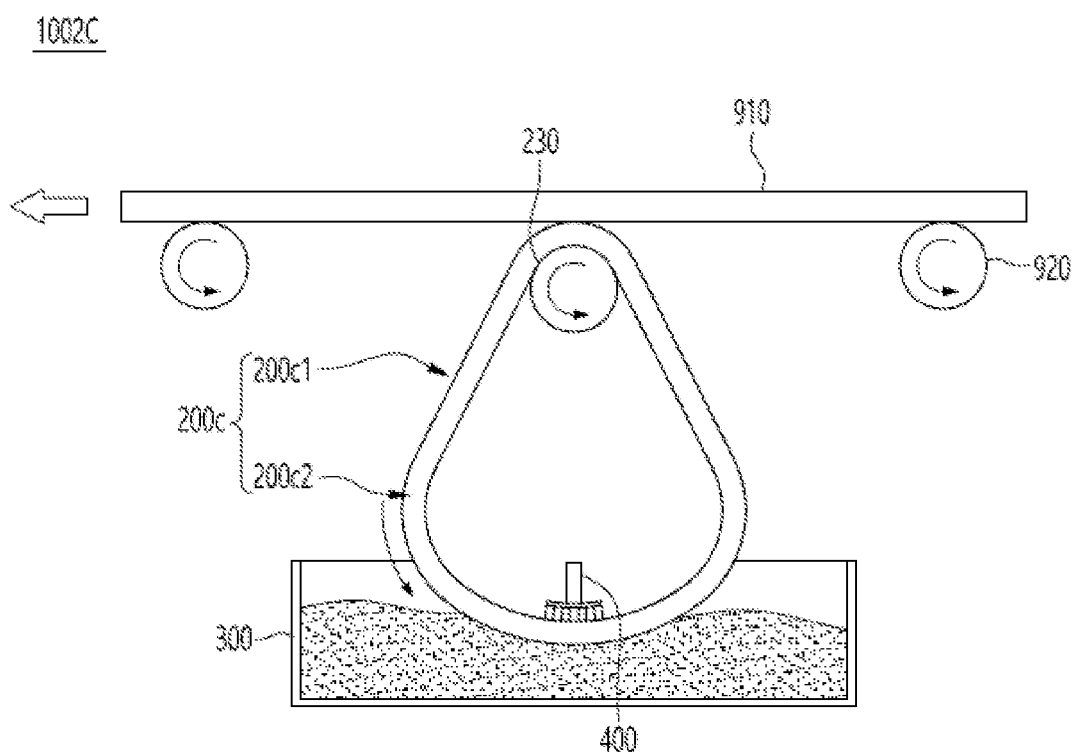

[Figure 9]
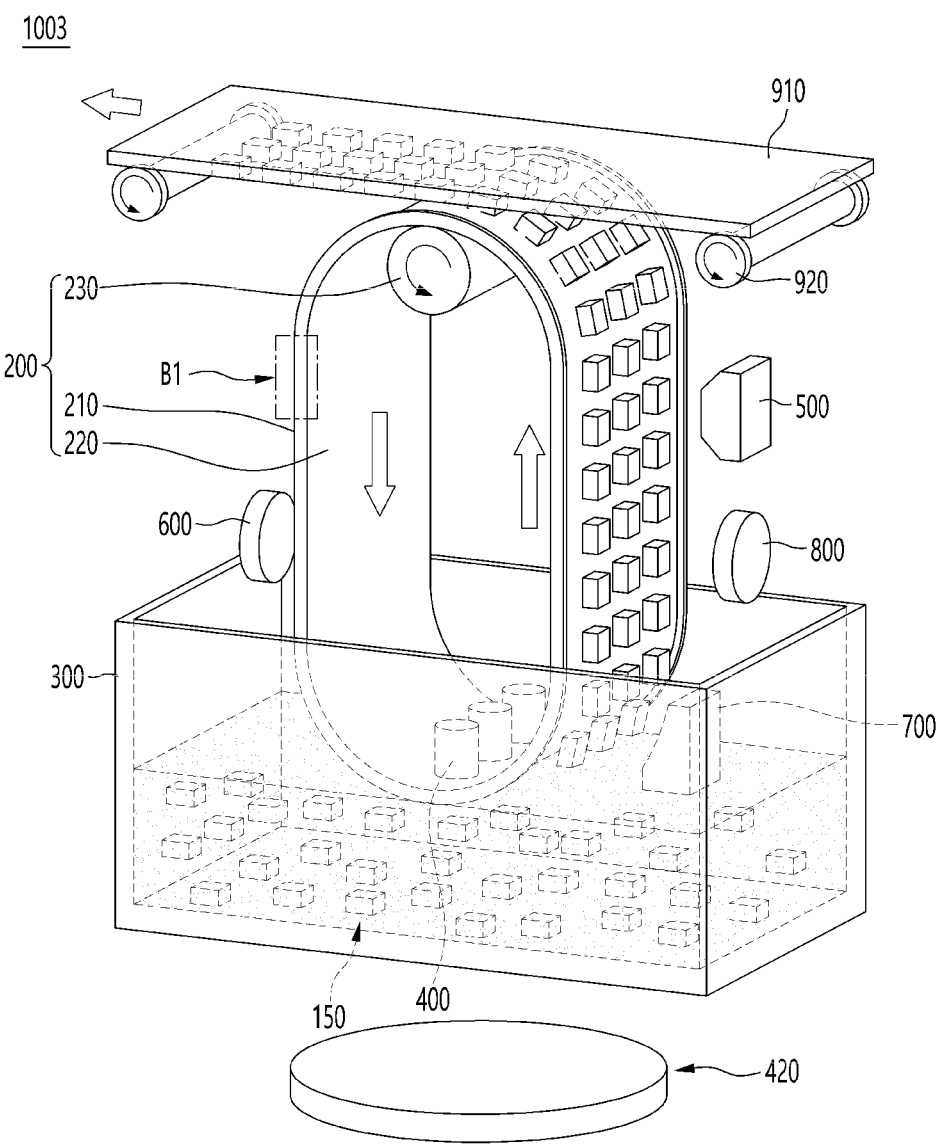

INTELLIGENT INTEGRATED ASSEMBLY AND TRANSFER APPARATUS FOR SEMICONDUCTOR LIGHT EMITTING DEVICE

CROSS-REFERENCE TO RELATED APPLICATION

This application claims under 35 U.S.C. § 119 to Korean Patent Application No. 10-2020-0057811 filed May 14, 2020, which is hereby incorporated by reference.

TECHNICAL FIELD

The embodiment relates to an integrated assembly and transfer apparatus of a semiconductor light emitting device. Specifically, the embodiment relates to an intelligent integrated assembly and transfer apparatus of a semiconductor light emitting device that can not only increase the transferring speed but also improve the transferring yield by integrally performing assembling and transferring in transferring the semiconductor light emitting device to the display panel.

BACKGROUND ART

Technologies for implementing large-scale displays include liquid crystal displays (LCDs), OLED displays, and micro-LED displays.

Meanwhile, the micro-LED display is a display using a micro-LED which is a semiconductor light emitting device having a diameter or cross-sectional area of 100 μm or less, as a display element.

In addition, since the micro-LED display uses the micro-LED as a display element, it has excellent performance in many characteristics such as contrast ratio, response speed, color reproduction rate, viewing angle, brightness, resolution, lifetime, luminous efficiency, and luminance.

In particular, the micro-LED display has the advantage of being able to separate and combine the screens in a modular manner, so that the size and resolution can be freely controlled and the flexible display can be implemented.

However, there is a technical problem that it is difficult to quickly and accurately transfer a semiconductor light emitting device to a display panel because a large-scale micro-LED display requires millions of semiconductor light emitting devices.

Transfer technologies include a pick and place method, a laser lift-off method, or a self-assembly method.

Among them, the self-assembly method is a method in which the semiconductor light emitting device finds its own assembly position in a fluid, and is an advantageous method for implementing a large-screen display device.

Recently, in U.S. Pat. No. 9,825,202, a micro-LED structure suitable for self-assembly has been proposed, but research on a technology for manufacturing a display through self-assembly of a micro-LED is still insufficient.

In particular, in the case of quickly transferring millions of semiconductor light emitting devices to a large display in the related art, the transfer speed may be improved, but there is a problem in that the transfer error rate may be increased, resulting in lower transfer yield. On the other hand, in the case of attempting to increase the transfer yield by lowering the transfer defect rate, there is a problem in that transfer speed is lowered. Therefore, there is a technical contradiction between the transfer speed and the transfer yield.

DISCLOSURE

Technical Problem

One of the technical problems of the embodiment is to provide an intelligent integrated assembly and transfer apparatus of a semiconductor light emitting device capable of simultaneously improving transfer speed and transfer yield in transferring semiconductor light emitting devices to a display panel.

The technical problems of the embodiments are not limited to those described in this section, and include those that can be interpreted through the description of the invention.

Technical Solution

The intelligent integrated assembly and transfer apparatus according to the embodiment can include a fluid chamber 300, a roller unit 200 and assembly inspection unit 500. The fluid chamber 300 can accommodate semiconductor light emitting devices 150. Semiconductor light emitting devices 150 can be assembled on an assembly substrate 210. The assembly substrate 210 can be mounted on the roller unit 200. The roller unit 200 can rotate the assembly substrate 210. The assembly inspection unit 500 can inspect the semiconductor light emitting devices 150 assembled on the assembly substrate 210.

The roller unit 200 can include a roller rotated part 220 where the assembly substrate 210 is mounted and rotated, a roller driving part 230 for rotating the roller rotated part 220, and a magnet head unit 400 for applying magnetic force to the semiconductor light emitting devices 150 to be assembled on the assembly substrate 210.

The assembly inspection unit 500 can be controlled by inspecting an assembly status of each line in a width direction of the assembly substrate 210 so that a transfer process does not proceed to a panel substrate 910 in the case of unassembled or defective assembly.

The assembly state of each line can be inspected in the width direction of the assembly substrate 210 and when there is an error position E of unassembled or defective assembly, a predetermined panel chuck separates the panel substrate 910 from the assembly substrate 210 such that the semiconductor light emitting device 150 in an error position is not transferred to the panel substrate 910.

The panel chuck can be arranged on side, top, or bottom of the panel substrate 910 for separating the panel substrate 910 from the assembly substrate 210.

The magnet head unit 400 can apply the magnetic force evenly to the semiconductor light emitting devices 150 by rotating or moving horizontally.

The panel chuck can have a function of rotating the panel substrate 912 while the panel substrate 912 is in an inclined state.

The intelligent integrated assembly and transfer apparatus further can have a panel driving unit 920B for driving to move the panel substrate 910. The panel driving unit 920B includes a second-first panel driving unit 920$b$1 and a second-second panel driving unit 920$b$2, and the second-first panel driver (920$b$1) is disposed at a different height from the second-second panel driving unit 920$b$2.

The roller unit 900 can include a triangular shape or a round shape. And an area of the first-first roller part where the semiconductor light emitting devices 150 are assembled on the assembly substrate 210 is greater than the area of the first-second roller part where the semiconductor light emitting devices 150 are transferred to the panel substrate 910.

The intelligent integrated assembly and transfer apparatus can further have a second magnet head unit 420 disposed under the fluid chamber 300.

Advantageous Effects

According to the intelligent integrated assembly and transfer apparatus of the semiconductor light emitting device according to the embodiment, there is a technical effect of simultaneously improving the transfer speed and the transfer yield in transferring the semiconductor light emitting devices to the display panel.

According to an embodiment, the semiconductor light emitting device 150 can be assembled to the assembly substrate 210, and the assembled semiconductor light emitting devices 150 can be transferred in-line to the panel substrate 910 immediately so that the transfer speed can be significantly improved.

In addition, according to an embodiment, the semiconductor light emitting devices 150 assembled on the assembly substrate 210 can be inspected in real time and then selectively transferred to the panel substrate 910 only when good, thereby significantly increasing the transfer yield.

Therefore, according to the embodiment, there is a special technical effect that can solve the problem of technical contradiction between the transfer speed and the transfer yield.

Specifically, according to an embodiment, a portion where the assembly substrate 210 on the roller unit 200 and the flat panel substrate 910 meet may line transfer in the width direction of the roller unit 200.

In addition, according to the embodiment, since only the semiconductor light emitting device on the fully assembled line without defects selected through the assembly inspection is transferred, it is possible to implement almost 100% transfer yield.

Accordingly, according to the embodiment, even if there is a defective assembly substrate or a defective semiconductor light emitting device, it can be avoided to be transferred, thereby minimizing the dependence on the quality of the semiconductor light emitting device.

In addition, according to the embodiment, since the assembly process and the transfer process are separated but connected inline, there is no effect of limiting the transfer area according to the size of the assembly system.

In addition, according to the embodiment, since a separate space for assembly is not required at the edge portion of the panel substrate, it is possible to secure a high chamfering rate when chamfering in a small area after a large area process.

In addition, according to the embodiment, when the roller unit is configured in a multi-layer, there is an effect capable of implementing high-speed transfer.

The technical effects of the embodiments are not limited to those described in this section, and include those that can be interpreted through the description of the invention.

DESCRIPTION OF DRAWINGS

FIG. 1 is an exemplary view of a display device 100 according to an embodiment disposed in a living room together with a washing machine 10, a robot cleaner 20, and an air purifier 30.

FIG. 2A is an enlarged view of area A1 in FIG. 1.

FIG. 2B is an enlarged view of region A2 in FIG. 2A.

FIG. 2C is a cross-sectional view of the semiconductor light emitting device 150 in FIG. 2B.

FIG. 3 is a conceptual diagram of the intelligent assembling and transferring apparatus 1000 according to an embodiment.

FIG. 4 is an enlarged view of region B1 of the assembly substrate 210 in the intelligent integrated assembly and transfer apparatus 1000 shown in FIG. 3.

FIGS. 5A and 5B are perspective views of the magnet head unit 400 in the intelligent integrated assembly and transfer apparatus 1000 shown in FIG. 3.

FIG. 6 is an exemplary operation of the intelligent integrated assembly and transfer apparatus 1000 according to the embodiment.

FIG. 7 is a conceptual tilting view of the panel substrate 910 in the embodiment.

FIGS. 8A to 8C are conceptual views of the intelligent integrated assembly and transfer apparatus 1000 according to a second embodiment.

FIG. 9 is a conceptual diagram of the intelligent integrated assembly and transfer apparatus 1003 according to a third embodiment.

MODE FOR INVENTION

Hereinafter, embodiments disclosed herein will be described in detail with reference to the accompanying drawings, but the same or similar elements will be given the same reference numbers regardless of the reference numerals, and redundant descriptions thereof will be omitted. The suffixes 'module', 'unit' and 'part' for the components used in the following description are given or mixed in consideration of the ease of writing the specification, and do not have meanings or roles distinguished from each other in themselves. In addition, the accompanying drawings are intended to facilitate understanding of the embodiments disclosed herein, and the technical features disclosed herein are not limited by the accompanying drawings. Also, when an element, such as a layer, region, or substrate, is referred to as being present on another component 'on', this includes directly on another element or between other intermediate elements.

The display device described herein includes a mobile phone, a smart phone, a laptop computer, a terminal for digital broadcasting, a personal digital assistants (PDA), a portable multimedia player (PMP), navigation, a slate PC, Tablet PCs, Ultra-Books, digital TVs, desktop computers, and the like can be included. However, the configuration according to the embodiment described in the present specification may be applied to a device capable of display, even in a new product form developed later.

First Embodiment

Prior to describing the intelligent integrated assembly and transfer apparatus of the semiconductor light emitting device according to the embodiment, the semiconductor light emitting device applied in the embodiment and the display device using the same will be described (hereinafter, the 'first embodiment' is referred to as an 'embodiment').

FIG. 1 is an exemplary view in which the display device 100 according to an embodiment is disposed in a living room together with a washing machine 10, a robot cleaner 20, an air cleaner 30, and the like.

The display device 100 of the embodiment can display the status of various electronic products such as the air cleaner 30, the robot cleaner 20, and the washing machine 10, and communicate with each electronic product based on IOT, and each electronic product may be controlled based on the setting data of the user.

The display device 100 according to the embodiment may include a flexible display manufactured on a thin flexible substrate. The flexible display may be bent or rolled like paper, while maintaining the characteristics of a flat panel display.

In the flexible display, visual information may be implemented by independently controlling light emission of unit pixels arranged in a matrix form. The unit pixel refers to a minimum unit for implementing one color. The unit pixel of the flexible display may be implemented by a semiconductor light emitting device. In an embodiment, the semiconductor light emitting device may be a Micro-LED.

Next, FIG. 2A is an enlarged view of the area A1 in FIG. 1, FIG. 2B is an enlarged view of the area A2 in FIG. 2A, and FIG. 2C is a cross-sectional view of the semiconductor light emitting device 150 in FIG. 2B.

Referring to FIG. 2A, the display device 100 of the embodiment may drive a semiconductor light emitting device in an active matrix (AM) or passive matrix (PM) method.

Next, referring to FIG. 2B, the display device 100 of the embodiment may include a panel substrate 910, a first panel electrode 120, a second panel electrode (not shown), an insulating layer 130, and a plurality of semiconductor light emitting devices 150.

Each of the semiconductor light emitting devices 150 may include red, green, and blue semiconductor light emitting devices to form a sub-pixel, but it is not limited thereto. And red color or green color can also be implemented with a red phosphor or a green phosphor respectively.

The panel substrate 910 may be formed of glass or polyimide. In addition, the panel substrate 910 may include a flexible material such as PEN (Polyethylene Naphthalate), PET (Polyethylene Terephthalate). In addition, the panel substrate 910 may be a transparent material, but it is not limited thereto.

The insulating layer 130 may include insulating and flexible materials such as polyimide, PEN, PET, and the like, and may be formed integrally with the panel substrate 910 to form a single substrate.

The insulating layer 130 may be a conductive adhesive layer having adhesiveness and conductivity, and the conductive adhesive layer may have ductility to enable a flexible function of the display device. For example, the insulating layer 130 may be an anisotropy conductive film (ACF) or a conductive adhesive layer such as an anisotropic conductive medium or a solution containing conductive particles. The conductive adhesive layer may be a layer that is electrically conductive in the vertical direction with respect to the thickness, but has electrical insulation in the horizontal direction with respect to the thickness.

Next, FIG. 2C is a cross-sectional view of a vertical type semiconductor light emitting device as an example of the semiconductor light emitting device 150 applied to the display device 100 of the embodiment. The semiconductor light emitting device that may be applied in the embodiment is not limited to a vertical type semiconductor light emitting device, and may include a lateral type semiconductor light emitting device or a flip type light emitting device.

The semiconductor light emitting device applied in the embodiment is a pn junction diode in which electrical energy is converted into light energy, and may be made of a compound semiconductor containing elements of group III and group V on the periodic table. The band gap can be controlled by adjusting the composition ratio of the compound semiconductor such that various colors such as red, green and blue are possible.

Referring to FIG. 2C, the semiconductor light emitting device 150 of the embodiment may include a light emitting structure 151, a first electrode 152a and a second electrode 152b. The light emitting structure 151 may include a first conductivity type semiconductor layer 151a, an active layer 151b, and a second conductivity type semiconductor layer 151c. A pad electrode (not shown) may be further disposed on the first electrode 152a or the second electrode 152b, but it is not limited thereto.

At least one of the first electrode 152a or the second electrode 152b may include a magnetic material layer (not shown). The first conductivity type may be n-type, and the second conductivity type may be p-type, but it is not limited thereto. The magnetic material layer may include at least one of Ni, SmCo(samarium-cobalt), Gd-based, La-based, and Mn-based materials. The magnetic material layer may be disposed in a mesh form or in a dot form to have excellent light transmittance.

One of the technical problems of the embodiment is to provide an intelligent integrated assembly and transfer apparatus capable of simultaneously improving the transfer speed and the transfer yield in transferring semiconductor light emitting devices to a display panel.

FIG. 3 is a conceptual diagram of an intelligent integrated assembly and transfer apparatus 1000 according to an embodiment. FIG. 4 is an enlarged view of the region B1 of the assembly substrate 210 in the intelligent integrated assembly and transfer apparatus 1000 shown in FIG. 3. FIGS. 5A and 5B are perspective views of the magnet head unit 400 in the intelligent integrated assembly and transfer apparatus 1000 shown in FIG. 3. FIG. 6 is a diagram illustrating an operation of the intelligent integrated assembly and transfer apparatus 1000 according to the embodiment.

In addition, the intelligent integrated assembly and transfer apparatus 1000 according to the embodiment may include a hydrophilic treatment unit 600, a cleaning unit 700, a drying unit 800, and the like.

In addition, the intelligent integrated assembly and transfer apparatus 1000 according to the embodiment may include a panel chuck (not shown) for moving the panel substrate 910 horizontally and a panel driving unit 920 for horizontally moving the display panel substrate 910.

According to an embodiment, the semiconductor light emitting device 150 can be assembled to the assembly substrate 210, and the assembled semiconductor light emitting devices 150 can be transferred in-line to the panel substrate 910 immediately so that the transfer speed can be significantly improved. In addition, according to an embodiment, the semiconductor light emitting devices 150 assembled on the assembly substrate 210 can be inspected in real time and then selectively transferred to the panel substrate 910 only when good, thereby significantly increasing the transfer yield. Accordingly, according to the embodiment, there is a special technical solving the problem of technical contradiction between the transfer speed and the transfer yield.

Hereinafter, the intelligent integrated assembly and transfer apparatus 1000 according to the embodiment will be described in detail with reference to FIGS. 3 to 6.

<Fluid Chamber, Hydrophilic Treatment Unit>

Referring to FIG. 3, the intelligent integrated assembly and transfer apparatus 1000 according to the embodiment may include the fluid chamber 300 accommodating a plurality of semiconductor light emitting devices 150, the hydrophilic treatment unit 600, and the like.

The fluid chamber 300 may be a water tank, and may be open or closed shape. The fluid chamber 300 may be filled with assembly solution such as deionized water, but it is not limited thereto.

The hydrophilic treatment unit 600 may perform hydrophilic treatment for wetting before the assembly substrate 210 is inserted into the fluid.

<Assembly Substrate>

The embodiment may include an assembly substrate 210 mounted on the roller unit 200. The assembly substrate 210 may be referred to as a carrier substrate or a first transfer substrate.

For example, the assembly substrate 210 may be a flexible substrate that can be mounted on the roller rotated part 220. For example, the assembly substrate 210 may be a flexible material that can be rolled, and may be a polymer such as polyimide or a thin metal substrate, but it is not limited thereto.

FIG. 4 is an enlarged view of an area B1 of the assembly substrate 210 in the intelligent integrated assembly and transfer apparatus 1000 shown in FIG. 3.

The assembly substrate 210 may include a base portion 210a, a dielectric layer 210b, and a plurality of assembly electrodes 210c to form an electric field.

The base portion 210a can be made of an insulating material, and the plurality of assembly electrodes 210c may be bi-planar electrodes of a thin film or a thick film patterned on one surface of the base portion 210a. The assembly electrode 210c may be formed of a stack of Ti/Cu/Ti, Ag paste, and ITO.

The dielectric layer 210b may be made of inorganic materials such as $SiO_2$, SiNx, SiON, $Al_2O_3$, $TiO_2$, and $HfO_2$. In addition, the dielectric layer 210b may be formed of a single layer or a multi-layer as an organic insulator.

In addition, the assembly substrate 210 may include a plurality of cells 210d partitioned by the partition wall 210e. The cells 210d can be sequentially arranged along one direction, and may be formed of a polymer material. In addition, the partition wall 210e forming the cells 210d may be shared with neighboring cells 210d.

The partition wall 210e may protrude upward from the base portion 210a, and the cells 210d may be sequentially arranged along one direction by the partition wall 210e. For example, the cells 210d can be sequentially arranged in the column and row directions, respectively, and may have a matrix structure.

The interior of the cells 210d may be an assembly groove for accommodating the semiconductor light emitting device 150, and the assembly groove may be a space partitioned by the partition wall 210e.

The shape of the assembly groove may be the same or similar to the outer shape of the semiconductor light emitting device 150. For example, when the semiconductor light emitting device 150 has a quadrangular shape, the assembly groove may have a quadrangular shape. In addition, when the semiconductor light emitting device 150 is circular, the assembly groove may be circular. In addition, one semiconductor light emitting device 150 may be accommodated in each cell.

Meanwhile, the plurality of assembly electrodes 210c includes a plurality of electrode lines disposed at the bottom of each cell 210d, and the plurality of electrode lines may be extended to neighboring cells.

The plurality of assembly electrodes 210c may be disposed under the cells 210d, and different polarities may be applied to generate electric fields in the cells 210d. In order to form the electric field, the dielectric layer 210b may cover the plurality of assembly electrodes 210c, and the dielectric layer 210b may form the bottom of the cells 210d. When a power of a different polarity is applied to the pair of assembly electrodes 210c at the lower side of each cell 210d by a power supply unit (not shown), an electric field is formed, and the electric field generates the electric field into the cells 210d. The semiconductor light emitting device 150 may be accommodated and assembled.

<Roller Unit: Roller Rotated Part, Roller Driving Part, Magnetic Head Part>

The intelligent integrated assembly and transfer apparatus 1000 according to the embodiment may include a roller unit 200 that rotates the assembly substrate 210. The roller unit 200 may include a roller rotated part 220, a roller driving part 230, and a magnet head unit 400.

For example, the roller unit 200 includes a roller rotated part 220 on which an assembly substrate 210 is mounted and rotated, a roller driving part 230 driving the roller rotated part 220 to rotate, and may include a magnetic magnet head unit 400 applying a magnetic force to the semiconductor light emitting device 150 to be assembled to the assembly substrate 210.

When the semiconductor light emitting devices 150 assembled on the assembly substrate 210 are transferred to the panel substrate 910, the roller unit 200 can make the semiconductor light emitting device 150 be transferred to the panel substrate 910 when the assembly substrate 210 and the panel substrate 910 meet in one line or a plurality of lines.

The roller driving part 230 may rotate the roller rotated part 220 on which the assembly substrate 210 is mounted, and the roller driving part 230 may include a single or multiple motor, but it is not limited thereto.

The roller rotated part 220 may be formed of a flexible material so that the mounted assembly substrate 210 can be rotated efficiently. In addition, the roller rotated part 220 may be in the form of a belt, but it is not limited thereto. The roller rotated part 220 may have a thickness of 5 mm or less so that the magnetic force of the magnet head unit 400 can be easily transmitted to the semiconductor light emitting device 150 while the assembly substrate 210 is mounted, but it is not limited thereto.

The roller unit 200 may include a magnetic head part 400 that applies a magnetic force so that the semiconductor light emitting device 150 can be assembled to the assembly substrate 210.

FIG. 5A is a perspective view of the magnet head unit 400 in the intelligent integrated assembly and transfer apparatus 1000 shown in FIG. 3, and FIG. 5B is a 180 degrees inverted perspective view of the magnet head unit 400 shown in FIG. 5A.

The magnet head unit 400 may be located inside the roller unit 200 to function to induce the semiconductor light emitting device 150 in the fluid chamber 300 toward the assembly electrode 210c of the assembly substrate 210. The magnet head unit 400 may be one or a plurality.

Referring to FIG. 5a, the magnet head unit 400 of the embodiment may include a plurality of magnets 410. The magnet 410 can be spaced apart from the fluid chamber 300 to apply a magnetic force to the semiconductor light emitting device 150, and the position may be controlled by a position controller (not shown) connected to the magnet 410. The magnet 410 may be a permanent magnet or an electromagnet.

The embodiment may include a magnet handler (not shown) that can automatically or manually move the magnet head unit 400, or a magnet (not shown) that can rotate the magnet head unit 400 to provide a magnet. The magnet head unit 400 may be rotated (Z) clockwise or counterclockwise, and the magnet head unit 400 may be horizontally driven (XY) in a direction perpendicular to the rotation direction of the assembly substrate 210.

In an embodiment, the magnet head unit 400 may rotate to evenly distribute the magnetic force applied to the semiconductor light emitting device 150 to improve assembly speed.

In addition, the magnet head unit 400 can distribute the magnetic force more evenly as it rotates while moving a certain section in the direction perpendicular to the rotation direction of the assembly substrate 210 to improve the assembly speed of the semiconductor light emitting device 150 and at the same time so that the semiconductor light emitting device 150 can be evenly assembled to the assembly substrate 210.

<Cleaning Unit, Drying Unit, Assembly Inspection Unit, Panel Driving Unit, Panel Chuck>

Referring back to FIG. 3, the intelligent integrated assembly and transfer apparatus 1000 according to the embodiment may include a cleaning unit 700, a drying unit 800, and an assembly inspection unit 500.

The cleaning unit 700 may eject the semiconductor light emitting device 150 attached outside the assembly area of the assembly substrate 210 by spraying a solution in an area other than the assembly area of the assembly substrate 210. The cleaning unit 700 can spray the solution to cover the whole the line to remove the semiconductor light emitting devices 150 at a time.

The drying unit 800 may apply hot air or heat to the semiconductor light emitting device 150 to evaporate the assembly solution before being transferred.

The assembly inspection unit 500 may check whether the semiconductor light emitting device 150 is assembled or correctly assembled to the assembly substrate 210.

The assembly inspection unit 500 may perform line scan assembly inspection, and cover the entire line at a time. The assembly inspection unit 500 may include a CCD image sensor, transmit the inspection results to a control unit (not shown), and determine whether to transfer the semiconductor light emitting device 150 to the panel substrate 910 according to the inspection results.

FIG. 6 is a diagram illustrating an operation of the intelligent integrated assembly and transfer apparatus 1000 according to the embodiment.

The intelligent integrated assembly and transfer apparatus 1000 according to the embodiment may include a panel driving unit 920 for horizontally moving the display panel substrate 910 and a panel chuck (not shown) for vertically moving the panel substrate 910.

The panel driving unit 920 may be provided in a single or plural form, and is illustrated in FIG. 6 as two, but it is not limited thereto. The panel driving unit 920 may be driven through a motor, but it is not limited thereto.

The panel chuck can be disposed on at least one of a side surface, an upper surface, or a bottom surface of the panel substrate 910 to separate the panel substrate 910 from the assembly substrate 210.

According to an embodiment, the assembly state of each line can be inspected in the width direction of the assembly substrate 210 to transfer line position information. When there is unassembled or defective assembly, the system control unit (not shown) can control the semiconductor light emitting device 150 on unassembled or defective assembly line not to be transferred to the panel substrate 910.

For example, the assembly inspection unit 500 can inspect the assembly state of each line in the width direction of the assembly substrate 210, and when there is an error position E such as unassembled or defective assembly, the panel substrate 910 can be moved upward by the panel chuck. By separating the assembly substrate 210 and the panel substrate 910, there is a special technical effect controlling the semiconductor light emitting device 150 on the error position E line not being transferred to the panel substrate 910.

According to an embodiment, when the semiconductor light emitting device 150 is not assembled or properly assembled in the line-by-line pixels on the assembly substrate 210, the semiconductor light emitting device 150 on the corresponding Error line cannot be transferred to the panel substrate 910. There is a special technical effect simultaneously increasing the transfer speed and the transfer yield.

FIG. 7 is a conceptual tilting view of the panel substrate 910 in the embodiment.

In an embodiment, the panel chuck may have a fine rotation function of the panel substrate 910 so that the semiconductor light emitting device 150 can be better transferred from the assembly substrate 210 to the panel substrate 910.

Referring to FIG. 7A, in an embodiment, the panel driving unit 920 may include a first-first panel driving unit 920a1 and a first-second panel driving unit 920a2. The height of the first-first panel driving unit 920a1 and the first-second panel driving unit 920a2 may be the same, and accordingly, the panel substrate 910 can be moved while maintaining the horizontal position, thereby causing the semiconductor light emitting device 150 to move.

Meanwhile, referring to FIG. 7B, in the embodiment, the second panel driving unit 920B includes a second-first panel driving unit 920b1 and a second-second panel driving unit 920b2. The second-first panel driving unit 920b1 may be disposed at a different height from the second-second panel driving unit 920b2.

For example, the second-first panel driving unit 920b1 may be disposed lower than the second-second panel driving unit 920b2. Accordingly, a front end 912b1 of the second panel substrate 912 may be disposed lower than a rear end 912b2. As the second panel substrate 912 can be moved in an inclined state, transferring of the semiconductor light emitting device 150 can be more effectively performed. Accordingly, the semiconductor light emitting device 150 can be more effectively transferred from the assembly substrate 210 to the second panel substrate 912.

According to the intelligent integrated assembly and transfer apparatus according to an embodiment, there is a technical effect of simultaneously improving the transfer speed and the transfer yield in transferring the semiconductor light emitting devices to the display panel.

Specifically, according to an embodiment, a portion where the assembly substrate 210 on the roller unit 200 and the flat panel substrate 910 meet may line transfer in the width direction of the roller unit 200.

In addition, according to the embodiment, since only the semiconductor light emitting device on the fully assembled line without defects selected through the assembly inspection can be transferred, it is possible to implement almost 100% transfer yield.

Accordingly, according to the embodiment, even if there is a defective assembly substrate or a defective semiconductor light emitting device, the defective assembly substrate or defective semiconductor light emitting device can be avoided to be transferred, thereby minimizing the dependence on the quality of the semiconductor light emitting device.

In addition, according to the embodiment, since the assembly process and the transfer process are separated but connected inline, there is no effect of limiting the transfer area according to the size of the assembly system.

In addition, according to the embodiment, since a separate space for assembly is not required at the edge portion of the panel substrate, it is possible to secure a high chamfering rate when chamfering in a small area after a large area process.

In addition, according to the embodiment, when the roller unit is configured in a multi-layer, there is an effect capable of implementing high-speed transfer.

<Assembly, Inspection, Transfer Process>

Hereinafter, an assembly, inspection, and transfer process using the intelligent integrated assembly and transfer apparatus 1000 according to FIGS. 3 and 6 will be described.

First, the semiconductor light emitting device 150 can be introduced into the fluid chamber 300, and the assembly substrate 210 can be mounted on the roller unit 200.

Next, a magnetic force can be applied to the semiconductor light emitting device 150 using the magnet head unit 400 so that the semiconductor light emitting device 150 can float in the vertical direction in the fluid chamber 300.

When the magnetic force can be adjusted when the magnet head unit 400 is an electromagnet, the separation distance between the assembly surface of the assembly substrate 210 and the semiconductor light emitting device 150 may be controlled. For example, the separation distance may be controlled using the weight, buoyancy, and magnetic force of the semiconductor light emitting device 150.

Next, a magnetic force can be applied to the semiconductor light emitting device 150 so that the semiconductor light emitting device 150 can move along one direction in the fluid chamber 300. For example, the magnet of the magnet head unit 400 may be rotated clockwise or counterclockwise while moving in the direction perpendicular to the rotational direction of the assembly substrate 210.

Next, in the process of moving the semiconductor light emitting device 150, a step of applying an electric field to the semiconductor light emitting device 150 so as to be seated at the assembly position of the assembly substrate 210 is conducted. For example, while the semiconductor light emitting device 150 moves along the assembly substrate 210, the semiconductor light emitting device 150 can rest on an assembly position of the assembly substrate 210 by moving in a vertical or horizontal direction with the assembly substrate 210 by an electric field.

For example, an electric field may be generated by supplying power to the bi-planar electrode of the assembly substrate 210, and the assembly may be controlled to be assembled only at the assembly position. That is, by using the selectively generated electric field, the semiconductor light emitting device 150 can be self-assembled at the assembly position of the assembly substrate 210.

Next, the cleaning unit 700 may eject the semiconductor light emitting device 150 attached outside the assembly area of the assembly substrate 210 by spraying a solution outside the assembly area so that the entire line can be covered at one time.

Next, the drying unit 800 may apply hot air or heat to the assembled semiconductor light emitting device 150 to make the assembly solution to evaporate before be transferring.

Next, the assembly inspection unit 500 may inspect whether the semiconductor light emitting device 150 is assembled to the assembly substrate 210 or not. The assembly inspection unit 500 may perform line scan assembly inspection, and may cover the entire line at a time. The assembly inspection unit 500 may include a CCD image sensor, transmit inspection results to a control unit, and determine whether to transfer the semiconductor light emitting device 150 to the panel substrate 910 according to the inspection results.

Next, referring to FIG. 6, according to the intelligent integrated assembly and transfer apparatus 1000 according to an embodiment, line position information in the case of unassembled or defective assembly can be inspected by inspecting the assembly state of each line in the width direction of the assembly substrate 210 so that the unassembled or defective assembly line does not proceed to be transferred to the panel substrate 910.

For example, by inspecting the assembly state of each line in the width direction of the assembly substrate 210, the panel substrate 910 can be moved upward through the panel chuck when there is an error position E such as unassembled or defective assembly. By separating the assembly substrate 210 from the panel substrate 910, there is a special technical effect to control the transfer process for making unassembled or defective assembly line not to be transferred to the panel substrate 910.

According to an embodiment, when the semiconductor light emitting device 150 is not assembled or properly assembled among the pixels for each line on the assembly substrate 210, the semiconductor light emitting device 150 on the corresponding Error line is not transferred to the panel substrate 910. There is a special technical effect simultaneously increasing the transfer speed and the transfer yield.

Referring back to FIG. 3, a post process for implementing the display device may be performed on the semiconductor light emitting device 150 transferred to the panel substrate 910.

Second Embodiment

FIGS. 8A to 8C are conceptual diagrams of the intelligent integrated assembly and transfer apparatus 1000 according to a second embodiment. The second embodiment may employ the technical features of the first embodiment, but will be described below mainly on the main features of the second embodiment.

The intelligent integrated assembly and transfer apparatus according to the second embodiment is an embodiment for another form of the roller unit.

Referring to FIG. 8A, in the second-first embodiment 1002A, the second-first roller unit 200a may have a circular shape, and the roller driving part 230 may be provided in one or a plurality.

According to the second embodiment, in order to improve the transfer speed and the transfer quality of the semiconductor light emitting device 150, the curvature at the time of assembly and the curvature at the time of transfer may be differently controlled.

Referring to FIG. 8B, in the second-second embodiment 1002B, the second-second roller unit 200b may have a triangular shape, and the roller driving part 230 may be provided in one or more.

Referring to FIG. 8B, in the assembly area where the semiconductor light emitting device 150 is assembled as the second-second roller unit 200b becomes a triangular shape, the contact area between the semiconductor light emitting device 150 and the assembly substrate 210 can be widened. As a result, the assembly speed can be increased, and in the transfer region where the semiconductor light emitting device 150 is transferred to the panel substrate 910, the transfer accuracy can be increased by making the panel substrate 910 and the assembly substrate 210 contact each line.

Also, referring to FIG. 8C, in the second-third embodiment 1002C, the second-third roller unit 200c may include a flat roller part 200c1 and a round roller part 200c2, and the roller drive part 230 may be provided in one or a plurality.

Referring to FIG. 8C, in the assembly area where the semiconductor light emitting device 150 is assembled, the assembly speed can be increased by widening the contact area between the semiconductor light emitting device 150 and the assembly substrate 210 through the round roller part 200c2. In the transfer region where the semiconductor light emitting device 150 is transferred to the panel substrate 910, the transfer accuracy can be increased by making the panel substrate 910 and the assembly substrate 210 contact each line.

According to the second embodiment, in order to improve the transfer speed and the transfer quality of the semiconductor light emitting device 150, the curvature at the time of assembly and the curvature at the time of transfer may be differently controlled. For example, in the assembly area, such as the second-second roller part 200b or the second-third roller part 200c, the assembly speed may be increased by widening the contact area with the assembly substrate 210, and the transfer accuracy can be increased by making assembly substrate 210 contact with the panel substrate 910 by line in the transfer area.

Third Embodiment

FIG. 9 is a conceptual diagram of an intelligent integrated assembly and transfer apparatus 1003 according to a third embodiment.

The third embodiment can adopt the technical features of the first and second embodiments.

According to the third embodiment, a second magnet head unit 420 can be disposed under the fluid chamber 300. The second magnet head unit 420 may include a permanent magnet or an electromagnet.

According to the third embodiment, by floating the semiconductor light emitting device 150 upward by the second magnet head unit 420 disposed under the fluid chamber 300, the possibility of assembly on the assembly substrate 210 and the assembly speed cab be significantly increased.

In addition, according to the third embodiment, the assembly position of the semiconductor light emitting device 150 can be rotated the upper side or lower side of the semiconductor light emitting device 150 by the second magnet head 420 disposed under the fluid chamber 300. There is a special technical effect that can significantly improve assembly accuracy along with assembly speed by controlling the rotation to correspond to the assembly area of the assembly substrate 210.

According to the intelligent integrated assembly and transfer apparatus of the semiconductor light emitting device according to the embodiment, there is a technical effect of simultaneously improving the transfer speed and the transfer yield in transferring the semiconductor light emitting devices to the display panel.

According to an embodiment, the semiconductor light emitting device 150 can be assembled to the assembly substrate 210, and the assembled semiconductor light emitting devices 150 can be transferred in-line to the panel substrate 910 immediately so that the transfer speed can be significantly improved.

In addition, according to an embodiment, the semiconductor light emitting devices 150 assembled on the assembly substrate 210 can be inspected in real time and then selectively transferred to the panel substrate 910 only when good, thereby significantly increasing the transfer yield.

Accordingly, according to the embodiment, there is a special technical effect that can solve the problem of technical contradiction between the transfer speed and the transfer yield.

Specifically, according to an embodiment, a portion where the assembly substrate 210 on the roller unit 200 and the flat panel substrate 910 meet may line transfer in the width direction of the roller unit 200.

In addition, according to the embodiment, since only the semiconductor light emitting device on the fully assembled line without defects selected through the assembly inspection is transferred, it is possible to implement almost 100% transfer yield.

Accordingly, according to the embodiment, even if there is a defective assembly substrate or a defective semiconductor light emitting device, it can be avoided to be transferred, thereby minimizing the dependence on the quality of the semiconductor light emitting device.

In addition, according to the embodiment, since the assembly process and the transfer process are separated but connected inline, there is no effect of limiting the transfer area according to the size of the assembly system.

In addition, according to the embodiment, since a separate space for assembly is not required at the edge portion of the panel substrate, it is possible to secure a high chamfering rate when chamfering in a small area after a large area process.

In addition, according to the embodiment, when the roller unit is configured in a multi-layer, there is an effect capable of implementing high-speed transfer.

The above description is merely illustrative of the technical features of the embodiment, and those skilled in the art to which the embodiment belongs will be able to make various modifications and variations without departing from the essential characteristics of the embodiment. Therefore, the embodiments disclosed in the embodiments are not intended to limit the technical feature of the embodiments, but to explain them, and the scope of the technical features of the embodiments is not limited by these embodiments. The scope of protection of the embodiments should be interpreted by the claims below, and all technical features within the equivalent ranges should be interpreted as being included in the scope of the embodiments.

The invention claimed is:

1. An intelligent integrated assembly and transfer apparatus for transferring semiconductor light emitting devices to a panel substrate, the apparatus comprising:
   a fluid chamber for accommodating the semiconductor light emitting devices;
   a roller unit where an assembly substrate is mounted, wherein the semiconductor light emitting devices are assembled on the assembly substrate and transferred in-line to the panel substrate, wherein the roller unit is configured to rotate the assembly substrate, and wherein the assembly substrate being rotated is configured to pick up the semiconductor light emitting devices from the fluid chamber; and an assembly inspection unit for inspecting the semiconductor light emitting devices assembled on the assembly substrate;

wherein the roller unit comprises:
- a roller rotated part where the assembly substrate is mounted and rotated,
- a roller driving part for rotating the roller rotated part, and
- a magnet head unit for applying magnetic force to the semiconductor light emitting devices to be assembled on the assembly substrate, wherein the roller unit includes a triangular shape or a round shape, and wherein an area of a first-first roller part of the roller unit where the semiconductor light emitting devices are assembled on the assembly substrate is greater than an area of a first-second roller part of the roller unit where the semiconductor light emitting devices are transferred to the panel substrate.

2. The intelligent integrated assembly and transfer apparatus according to claim 1, wherein the assembly inspection unit is configured to inspect the semiconductor light emitting devices assembled on the assembly substrate by inspecting an assembly status of each line in a width direction of the assembly substrate.

3. The intelligent integrated assembly and transfer apparatus according to claim 2, wherein the assembly state of each line is inspected in the width direction of the assembly substrate and when there is an error position of unassembled or defective assembly, a panel chuck separates the panel substrate from the assembly substrate such that a semiconductor light emitting device in the error position is not transferred to the panel substrate, from among the semiconductor light emitting devices.

4. The intelligent integrated assembly and transfer apparatus according to claim 3, wherein the panel chuck is arranged on at least one of side, top, or bottom of the panel substrate for separating the panel substrate from the assembly substrate.

5. The intelligent integrated assembly and transfer apparatus according to claim 1, wherein the magnet head unit applies the magnetic force evenly to the semiconductor light emitting devices by rotating or moving horizontally.

6. The intelligent integrated assembly and transfer apparatus according to claim 3, wherein the panel chuck has a function of rotating the panel substrate while the panel substrate is in an inclined state.

7. The intelligent integrated assembly and transfer apparatus according to claim 3, further comprising a panel driver to move the panel substrate, wherein the panel driver includes a second-first panel driver and a second-second panel driver, and wherein the second-first panel driver is disposed at a different height from the second-second panel driver.

8. The intelligent integrated assembly and transfer apparatus according to claim 1, further comprising a second magnet head unit disposed under the fluid chamber.

9. The intelligent integrated assembly and transfer apparatus according to claim 1, wherein the roller unit has at least the a triangular shape, the round shape, or a combination of a partially triangular shape and a partially round shape.

10. The intelligent integrated assembly and transfer apparatus according to claim 1, further comprising a hydrophilic treatment unit configured to perform a hydrophilic treatment for wetting a surface of the assembly substrate before the assembly substrate is inserted into a fluid in the fluid chamber.

11. The intelligent integrated assembly and transfer apparatus according to claim 1, wherein the semiconductor light emitting devices are assembled on an exterior surface of the assembly substrate, and wherein the first-first roller part, the first-second roller part and the magnet head unit are located to face an interior surface of the assembly substrate.

* * * * *